(12) United States Patent
 Miyoshi et al.

(10) Patent No.: US 10,872,779 B2
(45) Date of Patent: Dec. 22, 2020

(54) PLASMA ETCHING METHOD AND PLASMA ETCHING APPARATUS

(71) Applicant: HITACHI HIGH-TECH CORPORATION, Tokyo (JP)

(72) Inventors: Nobuya Miyoshi, Tokyo (JP); Hiroyuki Kobayashi, Tokyo (JP); Kazunori Shinoda, Tokyo (JP); Kohei Kawamura, Tokyo (JP); Kazumasa Ookuma, Tokyo (JP); Yutaka Kouzuma, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/286,262

(22) Filed: Feb. 26, 2019

(65) Prior Publication Data

US 2020/0006079 A1     Jan. 2, 2020

(30) Foreign Application Priority Data

Jun. 28, 2018  (JP) ................................ 2018-122658

(51) Int. Cl.
 *H01L 21/311*   (2006.01)
 *H01J 37/32*    (2006.01)
 (Continued)

(52) U.S. Cl.
 CPC .. *H01L 21/31116* (2013.01); *H01J 37/32449* (2013.01); *H01J 37/32724* (2013.01);
 (Continued)

(58) Field of Classification Search
 CPC ......... H01J 2237/002; H01J 2237/1825; H01J 2237/24585; H01J 2237/3341;
 (Continued)

(56) References Cited

U.S. PATENT DOCUMENTS

| 2009/0124083 A1* | 5/2009 | Nodera ............... C23C 16/0218 438/694 |
| 2010/0093179 A1* | 4/2010 | Hori .................. H01L 21/02238 438/723 |

(Continued)

FOREIGN PATENT DOCUMENTS

JP     2017092144 A    5/2017

*Primary Examiner* — Lan Vinh
(74) *Attorney, Agent, or Firm* — Miles & Stockbridge, P.C.

(57) ABSTRACT

An plasma etching method for etching a film layer includes a plurality of times repeating a step set including a first step of introducing a gas containing hydrogen fluoride into a processing chamber and supplying hydrogen fluoride molecules to the surface of an oxide film, a second step of exhausting the interior of the processing chamber in vacuum to remove the hydrogen fluoride, and a third step of introducing a gas containing hydrogen nitride into the processing chamber and supplying hydrogen nitride to the surface of the oxide film to form a compound layer containing nitrogen, hydrogen, and fluorine on the surface of the film layer, and removing the compound layer formed on the surface of the film layer. Foreign object contamination is prevented by inhibiting mixing of hydrogen fluoride gas and hydrogen nitride gas, and the etching amount is controlled by the number of times of repeating application thereof.

13 Claims, 10 Drawing Sheets

(51) Int. Cl.
*H01L 21/67* (2006.01)
*H01L 21/683* (2006.01)

(52) U.S. Cl.
CPC .. *H01L 21/67069* (2013.01); *H01L 21/67115* (2013.01); *H01L 21/67248* (2013.01); *H01J 2237/002* (2013.01); *H01J 2237/1825* (2013.01); *H01J 2237/24585* (2013.01); *H01J 2237/3341* (2013.01); *H01L 21/6831* (2013.01)

(58) Field of Classification Search
CPC ........... H01J 37/32449; H01J 37/32724; H01J 21/31116; H01J 21/67069; H01J 21/67109; H01J 21/67115; H01J 21/67248; H01J 21/6831
USPC ....... 438/706, 710, 712, 714, 719, 723, 736, 438/750, 758, 765; 156/345.15, 345.26, 156/345.29
See application file for complete search history.

(56) References Cited

U.S. PATENT DOCUMENTS

2015/0270148 A1* 9/2015 Shinoda ............ H01J 37/32724
                                                                                   156/345.35
2016/0247690 A1* 8/2016 Takahashi ......... H01L 21/31116
2018/0330962 A1 11/2018 Tomita et al.

* cited by examiner

PLASMA ETCHING METHOD AND PLASMA ETCHING APPARATUS

CROSS-REFERENCE TO RELATED APPLICATIONS

The present application claims priority to Japanese Patent Application No. 2018-122658, filed Jun. 28, 2018. The contents of this application are incorporated herein by reference in their entirety.

BACKGROUND OF THE INVENTION

1. Field of the Invention

The present invention relates to an plasma etching method and an plasma etching apparatus.

2. Description of the Related Art

In the field of semiconductor devices, further miniaturization and three-dimensional device structure are progressing due to the demand for lower power consumption and increased storage capacity. In manufacturing the device with a three-dimensional structure, in addition to "vertical (anisotropic) etching" in which etching proceeds in a direction perpendicular to the conventional wafer surface, "isotropic etching" which allows etching also in the lateral direction is often used. This is because the three-dimensional structure is more stereoscopic and complicated than a two-dimensional structure.

Conventionally, isotropic etching has been carried out by wet processing using chemical solutions, but, due to the progress of miniaturization, problems such as pattern collapse caused by surface tension of chemical solutions and unetched portions in minute gaps have occurred notably. In isotropic etching, therefore, there is an increasing tendency to adopt dry processing without using chemical solutions instead of wet processing using conventional chemical solutions.

JP 2017-92144 A discloses a method of processing a substrate, as an example of dry etching, in which HF gas molecules are adsorbed to a corner $SiO_2$ layer that is left at a corner portion of a groove of a wafer W from which an oxide film has been removed, the excess HF gas is exhausted, and $NH_3$ gas is supplied toward the corner $SiO_2$ layer to which molecules of HF gas are adsorbed. Accordingly, AFS is generated by reacting the corner $SiO_2$ layer, HF gas and $NH_3$ gas, and AFS is sublimed and removed.

SUMMARY OF THE INVENTION

In processing layered films of the next generation 3D-NAND flash memory and processing around the gate of the FinFET, for example, it is expected in the future to achieve a technique to carry out etching of the oxide film highly selectively and isotropically against the polycrystalline silicon film or silicon nitride film with controllability at the atomic layer level, but such a technique may not be achieved by the technique disclosed in JP 2017-92144 A. Further, in the technique disclosed in JP 2017-92144 A, there is a concern of contamination of the wafer due to foreign objects during processing.

The present invention has been made in view of the above problems, and it is an object of the present invention to provide an plasma etching method and an plasma etching apparatus capable of preventing contamination caused by foreign objects, while controlling etching amount highly accurately.

In order to solve the above-mentioned problems, a representative plasma etching method of the present invention is an plasma etching method for etching a film layer of an object to be processed disposed in a processing chamber inside a vacuum container and is made of a member containing silicon, the plasma etching method including forming a film by repeating a set of steps a plurality of times, the set of steps including a first step of introducing a gas containing at least hydrogen fluoride into the processing chamber and supplying hydrogen fluoride molecules to a surface of the film layer of the object to be processed, after said first step, a second step of stopping the supply of the gas containing hydrogen fluoride into said processing chamber, and exhausting the interior of the processing chamber to reduce the gas containing hydrogen fluoride, and after said second step, starting a third step of supplying hydrogen nitride molecules to the surface of the film layer of the object to be processed to form a compound layer containing nitrogen, hydrogen, and fluorine on the surface of the film layer, and removing the compound layer formed on the surface of the film layer to be processed after the forming of the film.

A typical plasma etching apparatus of the present invention is an plasma etching apparatus including a vacuum container in which an object to be processed made of a member containing silicon is disposed, a first gas source that supplies hydrogen fluoride gas into the vacuum container, a second gas source that supplies hydrogen nitride gas into the vacuum container, a heating device that heats the object to be processed, and a control unit, in which the control unit repeats a set of steps a plurality of times, the set of steps including introducing hydrogen fluoride gas from the first gas source into the processing chamber and supplying hydrogen fluoride molecules to a surface of a film layer of the object to be processed, exhausting the interior of the processing chamber while stopping the supply of the hydrogen fluoride gas into the processing chamber to reduce the hydrogen fluoride molecules in said processing chamber, and introducing hydrogen nitride gas from the second gas source into the vacuum container to form a compound layer containing nitrogen, hydrogen, and fluorine on the surface of the film layer, and heating the object to be processed by the heating device to remove the compound layer formed on the surface of the film layer.

Another typical plasma etching apparatus of the present invention is an plasma etching apparatus including a vacuum container in which an object to be processed made of a member containing silicon is disposed, a first gas source that supplies hydrogen fluoride gas into the vacuum container, a second gas source that supplies $N_2$ gas and $H_2$ gas into the vacuum container, a plasma device that generates plasma in the vacuum container, an exhaust device that exhausts the interior of the vacuum container, a heating device that heats the object to be processed, and a control unit, in which
the control unit repeats a set of steps a plurality of times, the set of steps including
introducing hydrogen fluoride gas from the first gas source into the processing chamber and supplying hydrogen fluoride molecules to a surface of a film layer of the object to be processed,
exhausting the interior of the processing chamber by the exhaust device to remove the hydrogen fluoride gas,
introducing $N_2$ gas and $H_2$ gas from the second gas source into the vacuum container and generating plasma in the vacuum container by the plasma device to generate $NH_3$ molecules, and
forming a compound layer containing nitrogen, hydrogen, and fluorine on the surface of the film layer, and
heating the object to be processed by the heating device to remove the compound layer formed on the surface of the film layer.

According to an embodiment of the present invention, it is possible to prevent generation of foreign objects and controlling etching amount highly accurately in isotropic dry etching of an oxide film.

Other problems, structures, and effects that have not been described above will be apparent from the following description of the embodiment.

DESCRIPTION OF THE PREFERRED EMBODIMENTS

Preferred embodiments of the present invention will be described in detail below with reference to the accompanying drawings. As used in the present specification, the terms "to exclude gas" is to exclude 70% or more, preferably 90% or more, and more preferably 99% or more of the input gas.

First, an isotropic dry plasma etching method of an oxide film illustrated as a reference example is described with reference to FIG. 1. It is assumed that, in an example film structure, an oxide film 1 is formed on a crystalline silicon substrate (wafer).

In this method, first, the surface of the oxide film 1 is irradiated with a mixed gas of hydrogen fluoride and hydrogen nitride in a vacuum environment such as a vacuum container. The adsorbed hydrogen fluoride molecules and hydrogen nitride molecules are reacted with the surface of the oxide film 1 to form a surface modified layer 2 made of diammonium hexafluorosilicate $(NH_4)_2SiF_6$. Next, thermal energy is applied to the silicon substrate, and the substrate is heated to approximately 120° C. or higher, whereby the modified layer 2 is converted into a highly volatile molecule through thermal decomposition reaction. As a result, the oxide film 1 can be etched by desorbing the modified layer.

Figure 2:
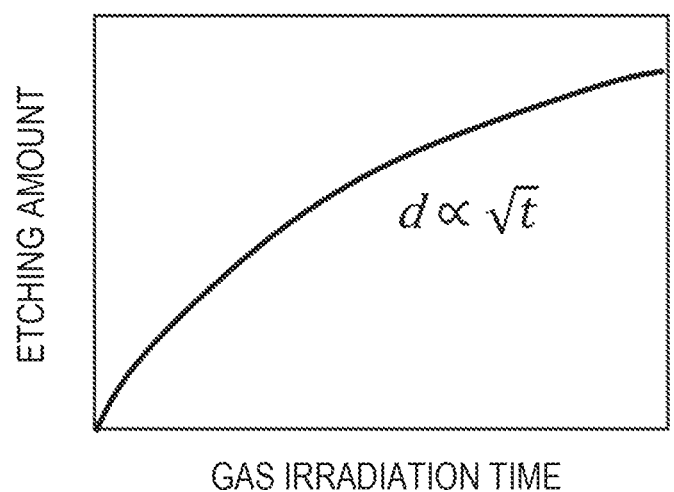
FIG. 2 is a graph illustrating the dependence of etching amount on gas irradiation time in the plasma etching method illustrated in FIG. 1, in which the vertical axis represents the etching amount and the horizontal axis represents the gas irradiation time.

The etching amount of the oxide film 1 is controlled as the film thickness of the modified layer 2 formed on the surface. It is known that a typical film thickness of the modified layer 2 is proportional to ½ power of irradiation time of the mixed gas of hydrogen fluoride and hydrogen nitride (FIG. 2). To increase the removal amount of the oxide film 1, it is necessary to increase the irradiation time of hydrogen fluoride and hydrogen nitride.

Figure 1:
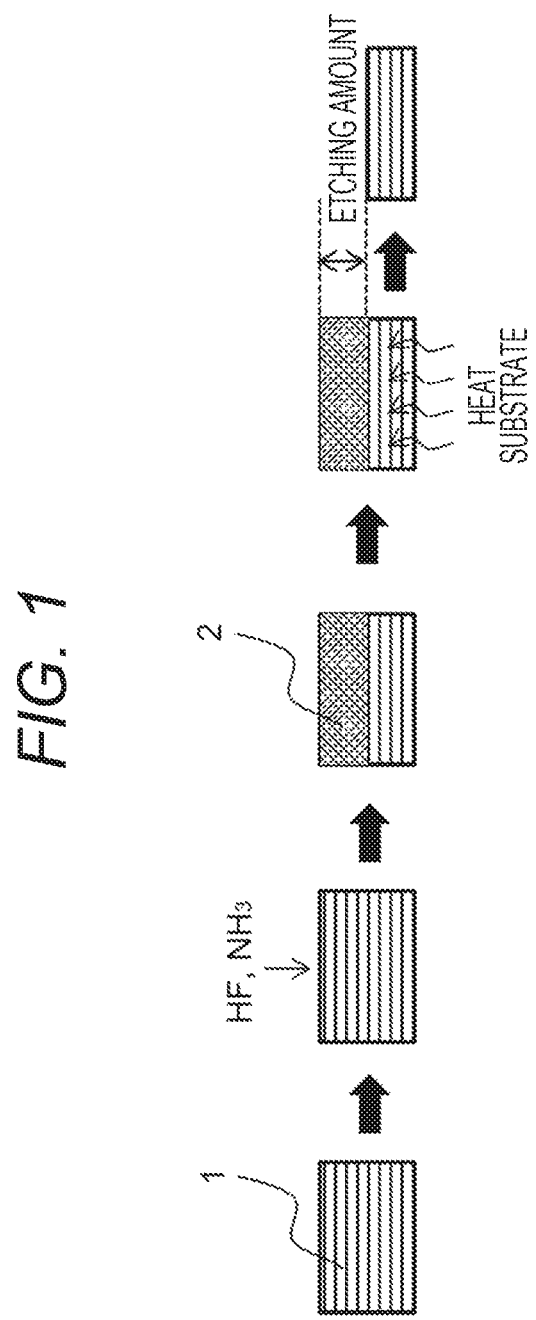
FIG. 1 is a schematic diagram of an etching process of etching an oxide film by supplying hydrogen fluoride and hydrogen nitride at the same time in a reference example.

However, in the method illustrated in FIG. 1, hydrogen fluoride and hydrogen nitride are mixed in the gas phase, so that the reaction of $HF+NH_3 \rightarrow NH_4F$ progresses in the gas phase or on the surface of the inner wall of the vacuum apparatus and ammonium fluoride ($NH_4F$) is generated. This causes contamination by foreign objects. This problem becomes particularly notable when the irradiation time of the mixed gas is prolonged in order to increase the etching amount.

Figure 3:
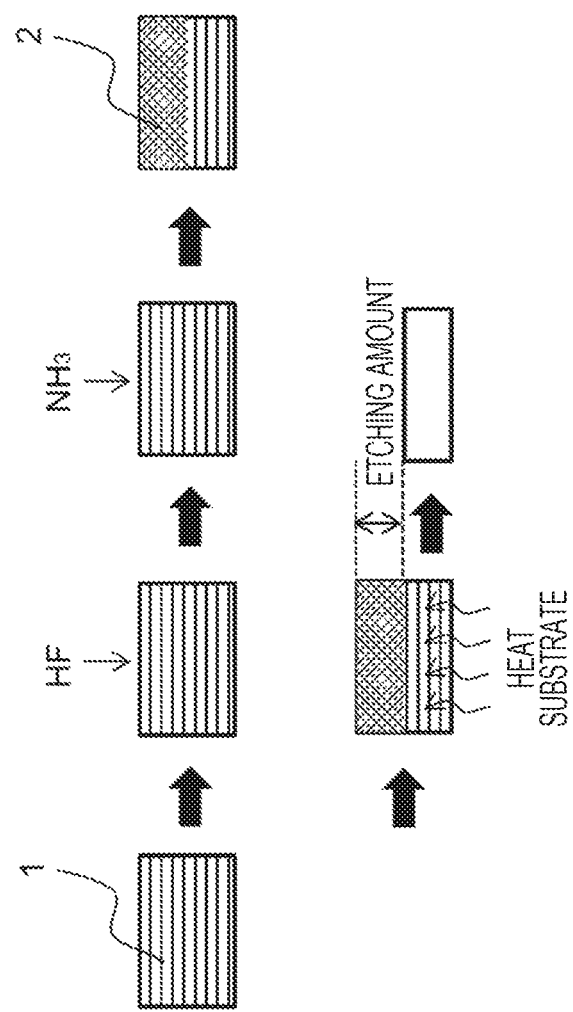
FIG. 3 is a schematic diagram of an etching process of etching an oxide film by supplying hydrogen fluoride and hydrogen nitride separately in a reference example.

As an example of solving the foreign object contamination with ammonium fluoride, there is a method of irradiating the oxide film 1 with hydrogen fluoride gas and hydrogen nitride gas separately, as illustrated in FIG. 3. In this method, first, hydrogen fluoride gas is introduced into the vacuum apparatus, and the molecules are adsorbed on the surface of the oxide film 1. Next, hydrogen fluoride gas in the gas phase is evacuated and then hydrogen nitride gas is introduced. As a result, the hydrogen fluoride molecules adsorbed earlier and the hydrogen nitride molecules adsorbed later react with the surface of the oxide film 1 to form the surface modified layer 2 made of diammonium hexafluorosilicate.

Next, the thermal energy is applied to the silicon substrate to heat the substrate to approximately 120° C. or higher, whereby the modified layer 2 is changed to highly volatile molecules by thermal decomposition reaction. Accordingly, the modified layer is desorbed to achieve etching the oxide film 1. In this case, the foreign object contamination due to the above-mentioned generation of ammonium fluoride ($NH_4F$) is prevented by executing exhaust in vacuum after applying hydrogen fluoride gas and inhibiting mixing of hydrogen fluoride gas and hydrogen nitride gas.

Figure 4:
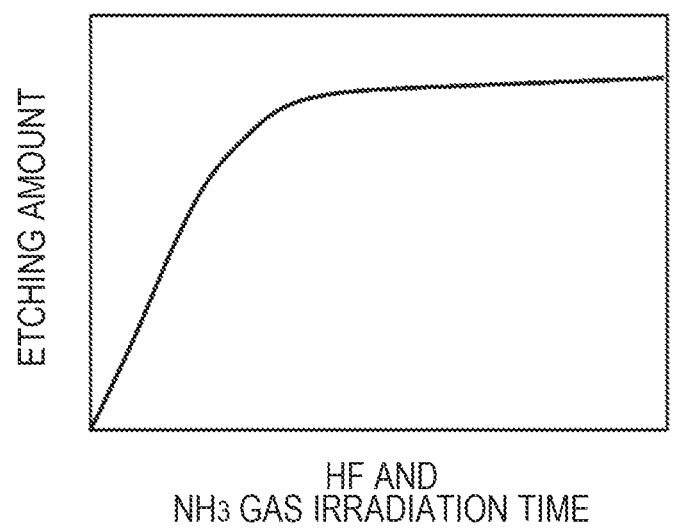
FIG. 4 is a graph illustrating the dependence of etching amount on gas irradiation time in the plasma etching method illustrated in FIG. 3, in which the vertical axis represents the etching amount and the horizontal axis represents the gas irradiation time.

FIG. 4 illustrates the relationship between the irradiation time of hydrogen fluoride gas or hydrogen nitride gas and the etching amount of the oxide film 1 (the thickness of the modified layer 2). Unlike the case where hydrogen fluoride gas and hydrogen nitride gas are simultaneously irradiated (FIG. 2), an increase in etching amount is saturated after predetermined time has passed with respect to an increase in gas irradiation time. To obtain a desired amount of etching, it is necessary to repeat a plurality of times a set of steps of applying hydrogen fluoride gas and executing exhaust in vacuum after that, applying hydrogen nitride gas, and applying thermal energy to the substrate for desorption.

Although the wafer temperature at the time of adsorption is not more than 70° C., the wafer temperature at desorption is 120° C. or more. After the wafer is heated, the wafer needs to be cooled down to the temperature of the adsorption before the next gas irradiation. Thus, this method repeats heating and cooling of the wafer a plurality of times, and rubbing occurs between the rear surface of the wafer and the wafer stage on which the wafer is placed due to thermal expansion and contraction of the wafer. This may cause another foreign object contamination different from the contamination mentioned above.

As described above, the conventional isotropic dry plasma etching method (FIGS. 1 and 3) of the oxide film cannot simultaneously achieve (1) prevention of foreign object contamination and (2) highly accurate control of the etching amount. These problems can be solved by an embodiment of the present invention.

Figure 5:
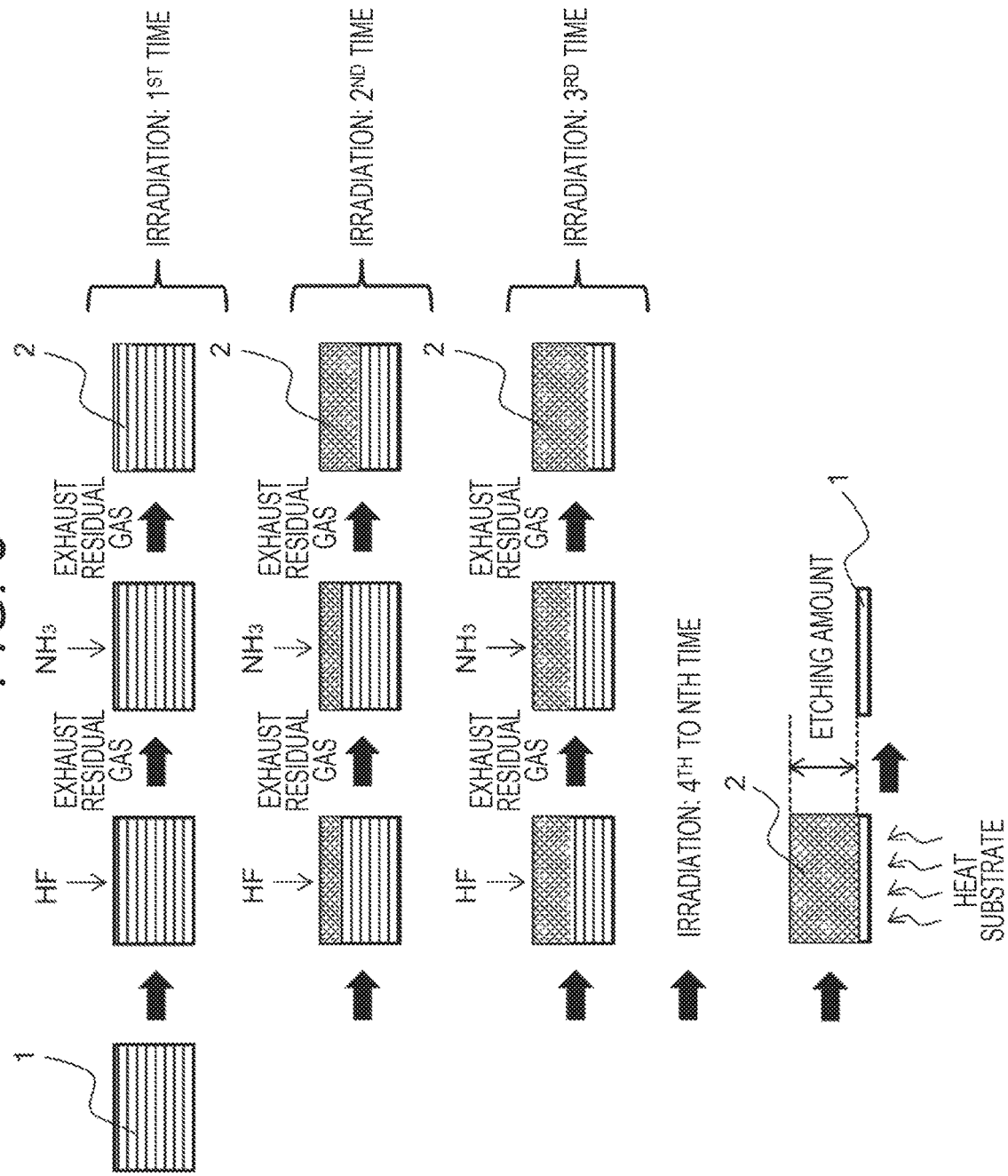
FIG. 5 is a schematic diagram illustrating an example of a processing procedure of an plasma etching method according to first and second embodiments of the present invention.

FIG. 5 illustrates the outline of the processing procedure of an plasma etching method according to the embodiment of the present invention. As a first step, hydrogen fluoride gas is supplied to and adsorbed on the surface of the oxide film 1 to be processed. Next, as a second step, the residual hydrogen fluoride gas left in the gas phase is exhausted in vacuum. Next, as a third step, hydrogen nitride gas is supplied to and adsorbed on the surface of the oxide film 1. Hydrogen fluoride molecules and hydrogen nitride molecules adsorbed on the surface react with the surface of the oxide film 1 to form a modified layer 2 of a compound containing nitrogen, hydrogen, and fluorine.

Subsequently, the first to third steps (also referred to as a step set) are repeated N times to grow the modified layer 2 to achieve a desired film thickness. Next, thermal energy is applied to the wafer to thermally decompose the modified layer 2 into volatile molecules and desorb the modified layer 2, thus etching the oxide film 1. The etching amount can be controlled on the basis of the number of times (N) of repeating the first to third steps. The step set may have different steps from the first to third steps mentioned above.

Figure 6:
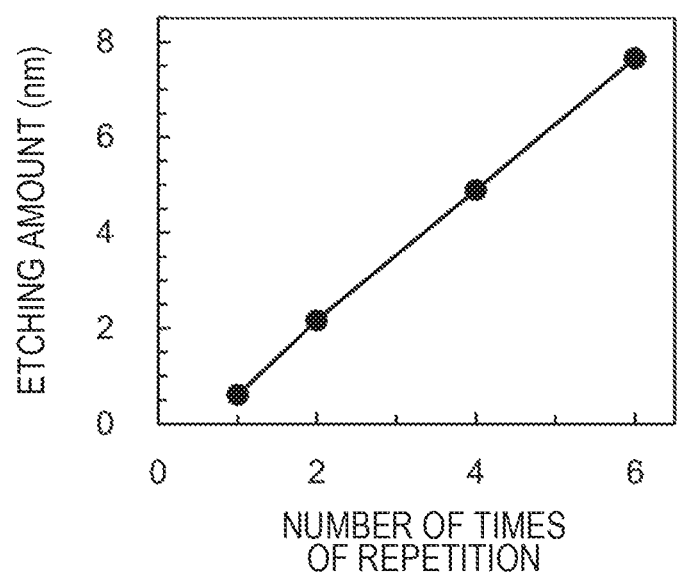
FIG. 6 is a graph illustrating an experimental result of the relationship between the etching amount and the number of times of repetition of gas irradiation when the plasma etching method of the present invention is used.

FIG. 6 illustrates the result of actually examining the dependence of the etching amount of the oxide film 1 on the number of times of repetition of the first to third steps. It is apparent that the etching amount can be controlled by the number of times of repetition of the first to third steps, because the etching amount monotonically increases with respect to the number of times of repetition. Further, mixing of the hydrogen fluoride gas and the hydrogen fluoride gas is inhibited by exhausting the interior of the processing chamber in vacuum to remove the hydrogen nitride gas before the start of the first step or after the completion of the third step.

First Embodiment

Figure 7:
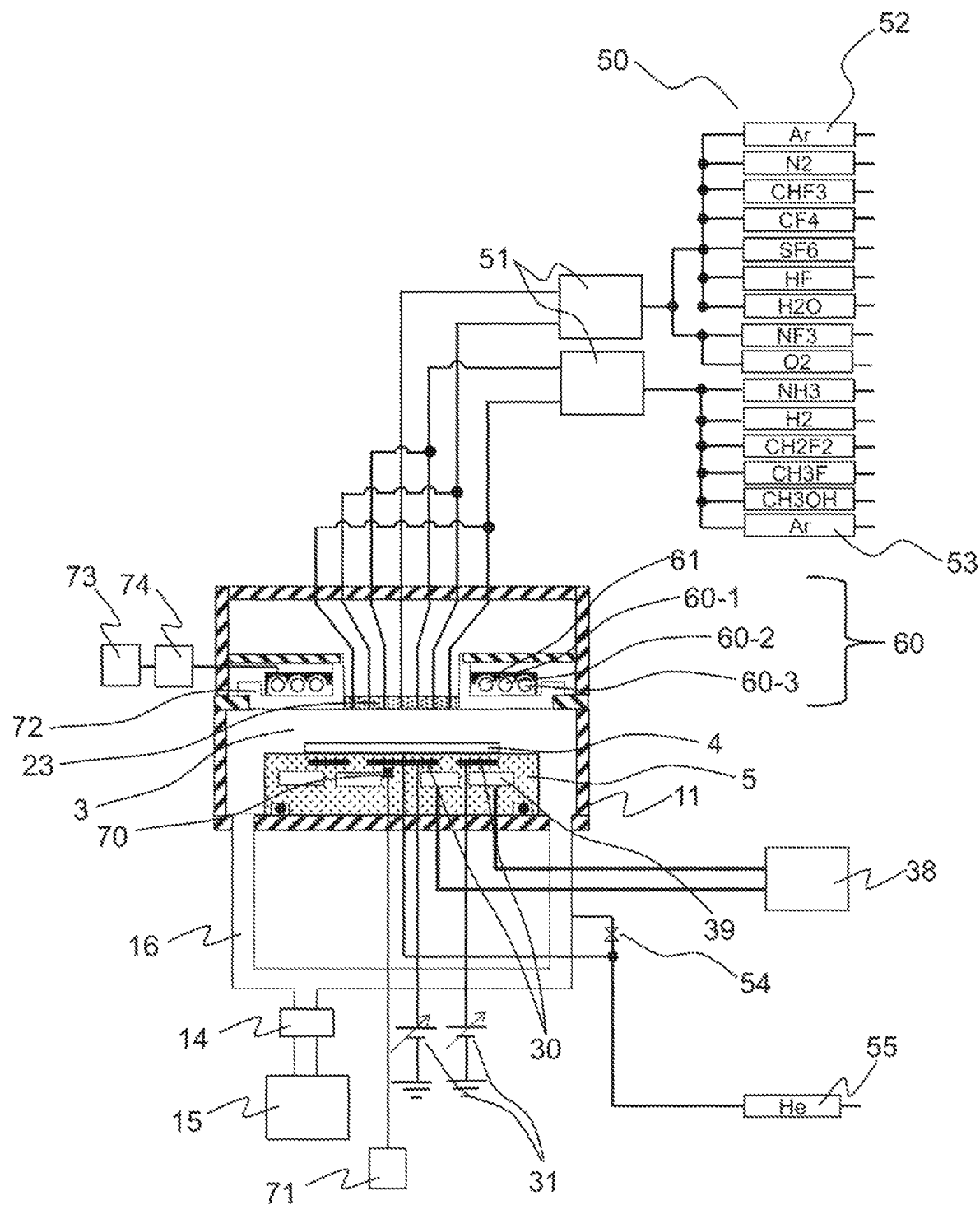
FIG. 7 is a cross-sectional view schematically illustrating an plasma etching apparatus according to a first embodiment of the present invention.

First, with reference to FIG. 7, an plasma etching apparatus and its overall structure according to the first embodiment of the present invention is described. A processing chamber 3 is a vacuum container and is constituted by a base chamber 11 in which a wafer stage 5 on which a wafer 4 is mounted is disposed. A shower plate 23 is disposed at the center of the upper side of the processing chamber, and a processing gas is supplied to the processing chamber 3 through the shower plate 23.

A flow rate of supplying the processing gas is adjusted by a mass flow controller (first gas source, second gas source) 50 provided for each type of gas. A gas distributor 51 is disposed on the downstream side of the mass flow controller 50 so as to independently control the flow rate and composition of the gas supplied near the center of the processing chamber 3 and the gas supplied near the outer circumference to be supplied. Thus, the spatial distribution of the partial pressure of the processing gas can be finely controlled.

In FIG. 7, Ar, $N_2$, $CHF_3$, $CF_4$, $SF_6$, HF, $H_2O$, $NF_3$, $O_2$, $NH_3$, $H_2$, $CH_2F_2$, $CH_3F$, $CH_3OH$ are illustrated as the processing gases, but other gasses may be used.

An exhaust unit 15 is connected to the lower part of the processing chamber 3 via a vacuum exhaust pipe 16 to reduce the pressure in the processing chamber. For example, a turbomolecular pump, a mechanical booster pump, or a dry pump is used, not in a limiting manner, as the exhaust unit. To adjust the pressure in the processing chamber 3, a pressure adjusting unit 14 is disposed in the vacuum exhaust pipe 16 connected to the exhaust unit 15.

An IR lamp unit (heating device) for heating the wafer 4 is disposed above the wafer stage 5. The IR lamp unit is mainly constituted by an IR lamp 60, a reflecting plate 61 for reflecting IR light, and an IR light transmitting window 72. In the IR lamp 60, circle-type (circular shaped) lamp parts 60-1, 60-2, and 60-3 are used.

It is assumed that the light emitted from the IR lamp is light (herein referred to as IR light) which mainly comes from a region between visible light and infrared light. In the present embodiment, the three circles of lamp parts 60-1, 60-2, and 60-3 are arranged concentrically, but the lamp parts may be two circles, or four circles and more. Above the IR lamp 60, the reflecting plate 61 for reflecting IR light downward (wafer setting direction) is disposed.

An IR lamp power source 73 is connected to the IR lamp 60, and a radio frequency cut filter 74 for preventing radio frequency power noise from flowing into the IR lamp power source is disposed therebetween. Further, the IR lamp power source 73 is provided with a function capable of independently controlling the power supplied to the IR lamp 60, so that the radial distribution of the heating amount of the wafer can be regulated (part of the wiring is not illustrated). At the center of the IR lamp 60, a space for disposing a shower plate for introducing the processing gas is formed.

A refrigerant flow path 39 for cooling the stage is formed inside the wafer stage 5, and the refrigerant is circulated and supplied by a chiller 38 via the flow path 39. Further, to fix the wafer 4 by electrostatic adsorption, plate-like electrode plates 30 are embedded in the stage, and a DC power source 31 is connected to each electrode plate 30.

To efficiently cool the wafer 4, He gas can be supplied between the rear surface of the wafer 4 and the wafer stage 5. Further, it is assumed that, to prevent damage to the rear surface of the wafer even when heating/cooling is performed while the wafer 4 is adsorbed, the surface (wafer mounting surface) of the wafer stage 5 is coated with a resin such as polyimide. A thermocouple 70 that measures the temperature of the stage is disposed inside the wafer stage 5, and this thermocouple 70 is connected to a thermocouple thermometer 71. These units are connected to a control unit (processor) (not illustrated) by cables such that operations of these units are controlled.

Figure 8:
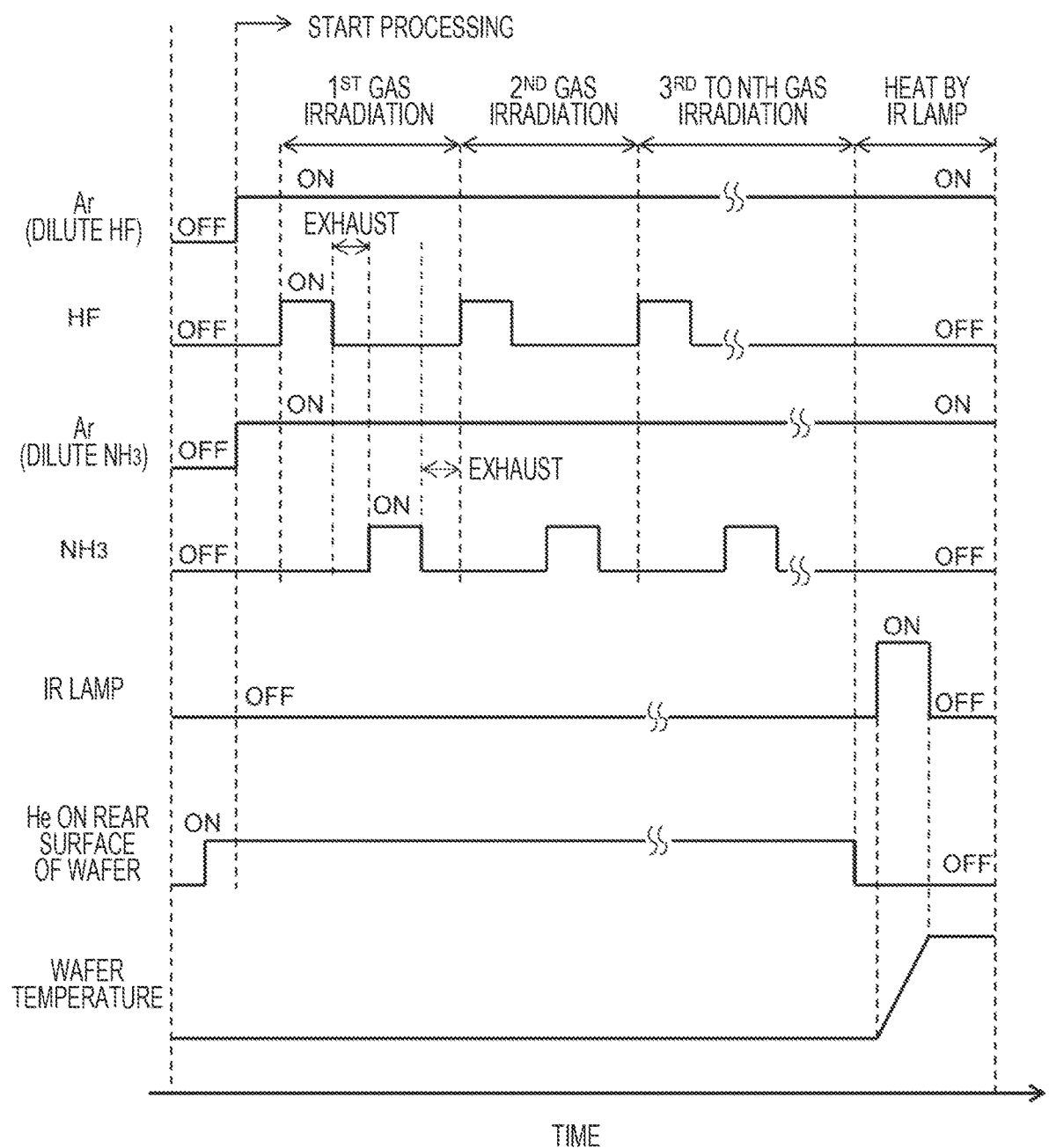
FIG. 8 is a time sequence diagram of an plasma etching method according to a first embodiment of the present invention.

Next, the etching process proposed in the present embodiment is described with reference to FIG. 8. The sequence of FIG. 8 is controlled by the control unit. First, the wafer 4 is transferred to the processing chamber 3 via a transfer port (not illustrated) provided in the processing chamber 3. After that, the wafer 4 is fixed on the wafer stage 5 by electrostatic adsorption by feeding power from the DC power source 31, while He gas is supplied to the rear surface of the wafer 4 for cooling the wafer.

Next, Ar gas 52 for diluting HF gas and Ar gas 53 for diluting $NH_3$ gas are supplied to the processing chamber 3 through the mass flow controller 50, the gas distributor 51, and the shower plate 23. After that, the Ar gases 52 and 53 for diluting are made to flow continuously until the etching is completed.

Subsequently, as a first step, HF gas is supplied to the processing chamber 3 to adsorb HF molecules on the surface of the wafer 4. Subsequently, as a second step, the supply of HF gas is stopped, while the Ar gases 52 and 53 for diluting flow continuously, to exhaust (eliminate) the residual HF gas left in the gas phase.

Subsequently, as a third step, $NH_3$ gas is supplied to the processing chamber 3 to adsorb $NH_3$ molecules on the surface of the wafer 4. At this time, HF molecules adsorbed in the first step and $NH_3$ molecules adsorbed in the third step react with the surface of the film to form the modified layer 2 of a compound containing nitrogen, hydrogen, silicon, and fluorine on the surface of the film.

The above-mentioned first to third steps are regarded as one step (also referred to as step set), and are repeated a plurality of times. As illustrated in FIG. 6, by repeating this step set, the film thickness (etching amount) of the modified layer 2 can be increased in a stepwise manner.

Further, between the third step (supply of $NH_3$ gas) and the first step (supply of HF gas) of the next step set, the supply of $NH_3$ gas is stopped, while the Ar gases 52 and 53 for diluting flow continuously, and an exhausting step of exhausting the residual $NH_3$ gas left in the gas phase is executed. Preferably, herein, in the second step or the exhausting step, the pressure in the processing chamber 3 is made lower than the pressure in the processing chamber 3 in the first and third steps.

After increasing the film thickness of the modified layer 2 to a desired value, the supply of the wafer-cooling He gas is stopped. Next, the wafer 4 is heated by the IR lamp 60 to thermally decompose and desorb the modified layer 2 that has been formed on the surface of the film, thus etching the film.

In the present embodiment, the IR lamp 60 is used for heating the wafer, but the heating method is not limited thereto. For example, the wafer stage may be heated or the wafer may be heated by separately conveying the wafer to a device that only performs heating. Further, in the present embodiment, the film of the object is etched by heating the wafer after repeating the first to third steps as one step set a plurality of times. Alternatively, it is also possible to achieve a desired etching amount by further repeating the combination of a plurality of times of gas irradiation and wafer heating.

In this case, after heating the wafer 4, He gas is supplied to the rear surface of the wafer to cool the wafer 4 to reach the temperature of the wafer stage 5 (refrigerant temperature), thus preparing for the next irradiation repetition step of HF gas and $NH_3$ gas. When the etching is completed, the electrostatic adsorption is interrupted to take out the wafer 4. The exhaust of He gas on the rear surface of the wafer is performed using the exhaust unit 15 via a valve 54.

In the etching described in the present embodiment, $NH_3$ gas is applied after HF gas. Alternatively, the order of irradiation may be reversed, and $NH_3$ gas may be applied before HF gas.

Second Embodiment

Figure 9:
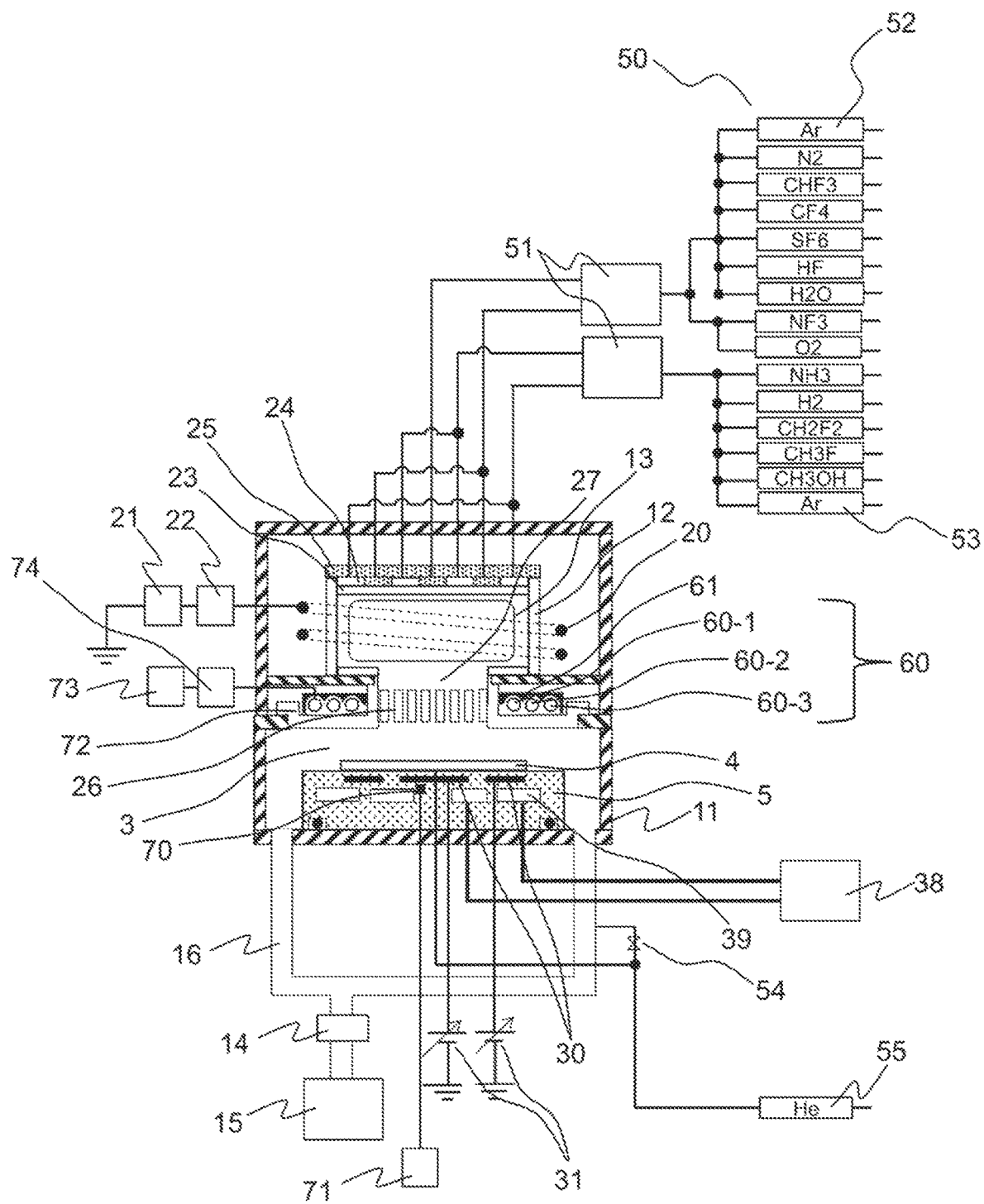
FIG. 9 is a cross-sectional view schematically illustrating an plasma etching apparatus according to a second embodiment of the present invention.

Next, with reference to FIG. 9, an plasma etching apparatus and its overall structure according to the second embodiment of the present invention is described. The processing chamber 3 is constituted by the base chamber 11 in which the wafer stage 5 on which the wafer 4 is mounted is disposed. A plasma source (ICP plasma source) using an ICP discharge method is disposed above the processing chamber 3. The ICP plasma source is used for cleaning the inner wall of the chamber by plasma or for generating reactive gas by plasma.

A cylindrical quartz chamber 12 constituting the ICP plasma source is disposed above the processing chamber 3, and an ICP coil 20 is disposed outside the quartz chamber 12. A radio frequency power source 21 for plasma generation is connected to the ICP coil 20 via a matching device 22. It is assumed that a frequency band of several tens MHz, such as 13.56 MHz, is used for the radio frequency power of the radio frequency power source 21. A top plate 25 is disposed on top of the quartz chamber 12. A gas dispersion plate 24 and the shower plate 23 are disposed under the top plate 25. The processing gas is introduced into the quartz chamber 12 via the gas dispersion plate 24 and the shower plate 23. A plasma apparatus is constituted by the quartz chamber 12 and the radio frequency power source 21.

A flow rate of supplying the processing gas is adjusted by the mass flow controller 50 provided for each type of gas. The gas distributor 51 is disposed on the downstream side of the mass flow controller 50 so as to independently control the flow rate and composition of the gas supplied near the center of the quartz chamber 12 and the gas supplied near the outer circumference to be supplied. Thus, the spatial distribution of the partial pressure of the processing gas can be finely controlled.

In FIG. 7, Ar, $N_2$, $CHF_3$, $CF_4$, $SF_6$, HF, $H_2O$, $NF_3$, $O_2$, $NH_3$, $H_2$, $CH_2F_2$, $CH_3F$, $CH_3OH$ are illustrated as the processing gases, but other gasses may be used.

An exhaust unit 15 is connected to the lower part of the processing chamber 3 via a vacuum exhaust pipe 16 to reduce the pressure in the processing chamber. For example, a turbomolecular pump, a mechanical booster pump or a dry pump is used as the exhaust unit, but it is not limited thereto. To adjust the pressure in the processing chamber 3, the pressure adjusting unit 14 is disposed in the vacuum exhaust pipe 16 connected to the exhaust unit 15.

The IR lamp unit for heating the wafer 4 is disposed on the wafer stage 5. The IR lamp unit is mainly constituted by the IR lamp 60, the reflecting plate 61 for reflecting IR light, and the IR light transmitting window 72. In the IR lamp 60, circle-type (circular shaped) lamp parts 60-1, 60-2, and 60-3 are used.

It is assumed that the light emitted from the IR lamp 60 is light (herein referred to as IR light) which mainly comes from the region between visible light and infrared light. In the present embodiment, the three circles of lamp parts 60-1, 60-2, and 60-3 are arranged concentrically, but the lamp parts may be two circles, or four circles and more. Above the IR lamp 60, the reflecting plate 61 for reflecting IR light downward (wafer setting direction) is disposed.

The IR lamp power source 73 is connected to the IR lamp 60, and the radio frequency cut filter 74 for preventing radio frequency power noise from flowing into the IR lamp power source is disposed therebetween. Further, the IR lamp power source 73 is provided with a function capable of independently controlling the power supplied to the IR lamp 60, so that the radial distribution of the heating amount of the wafer can be regulated (part of the wiring is not illustrated).

A flow path 27 is formed in the center of the IR lamp unit. A plurality of perforated slit plates 26 that shields ions and electrons generated in the plasma and transmits only neutral gas and neutral radicals to irradiate the wafer is disposed in the flow path 27.

A refrigerant flow path 39 for cooling the stage is formed inside the wafer stage 5, and the refrigerant is circulated and supplied by a chiller 38 via the flow path 39. Further, to fix the wafer 4 by electrostatic adsorption, plate-like electrode plates 30 are embedded in the stage, and a DC power source 31 is connected to each electrode plate 30.

To efficiently cool the wafer 4, He gas can be supplied between the rear surface of the wafer 4 and the wafer stage 5. Further, it is assumed that, to prevent damage to the rear surface of the wafer even when heating/cooling is performed while adsorbing the wafer, the surface (wafer mounting surface) of the wafer stage 5 is coated with a resin such as polyimide. Inside the wafer stage 5, a thermocouple 70 for measuring the temperature of the stage is disposed, and this thermocouple is connected to a thermocouple thermometer 71.

Figure 10:
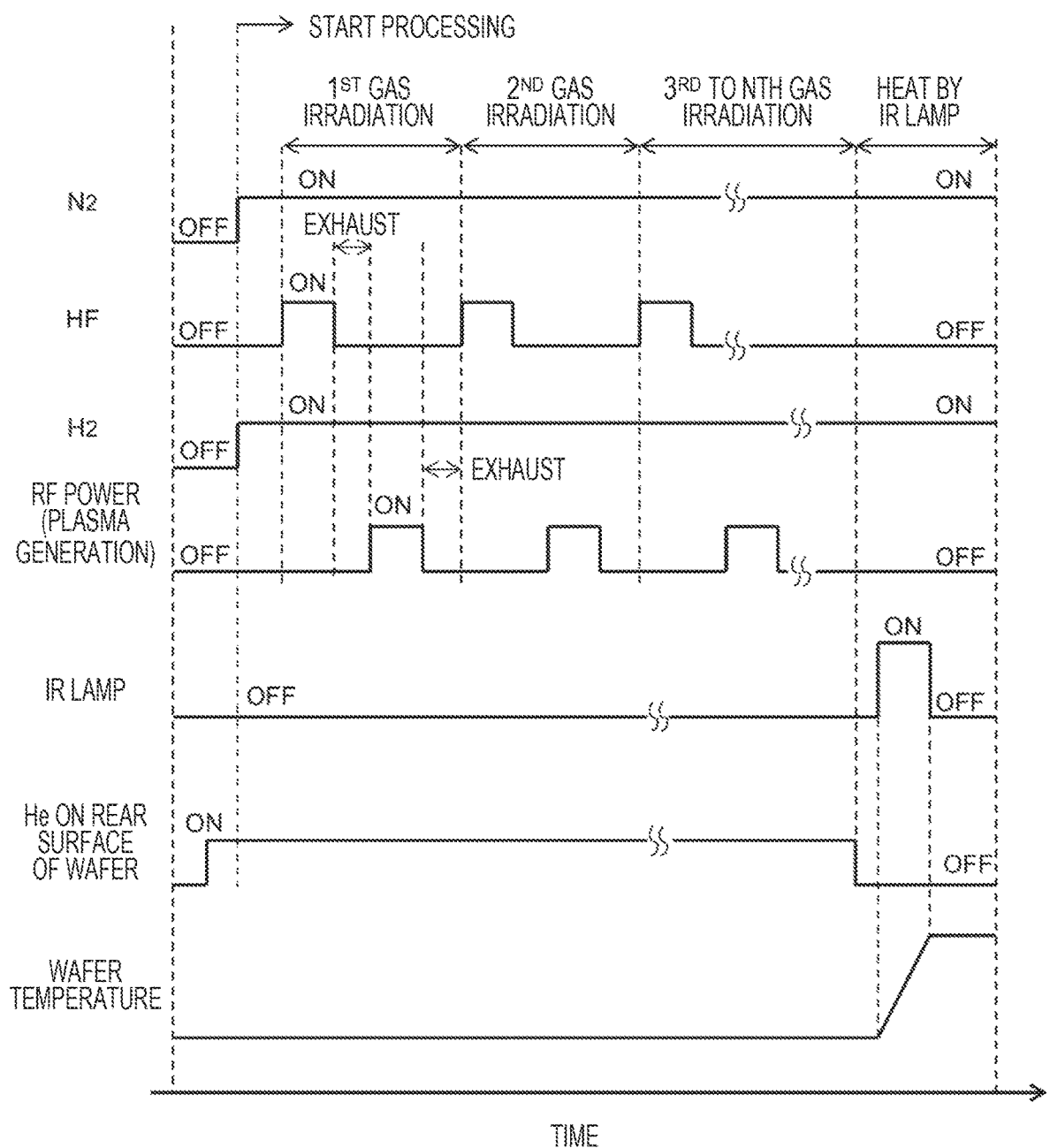
FIG. 10 is a time sequence diagram of an plasma etching method according to a modification of the second embodiment of the present invention.

Next, the etching process proposed in the present embodiment is described with reference to FIG. 10. The sequence illustrated in FIG. 8 can be used as the sequence of the present embodiment, and such sequence is controlled by the control unit (not illustrated). First, the wafer 4 is transferred to the processing chamber 3 via a transfer port (not illustrated) provided in the processing chamber 3. After that, the wafer 4 is fixed on the wafer stage 5 by electrostatic adsorption by feeding power from the DC power source 31, while He gas is supplied to the rear surface of the wafer 4 for cooling the wafer.

Next, Ar gas 52 for diluting HF gas and Ar gas 53 for diluting $NH_3$ gas are supplied into the quartz chamber 12 through the mass flow controller 50, the gas distributor 51, the gas dispersion plate 24, and the shower plate 23. The gas supplied to the quartz chamber 12 is further supplied to the processing chamber 3 via the flow path 27 and the slit plates 26. After that, the Ar gases 52 and 53 for diluting are made to flow continuously until the etching is completed.

Subsequently, as a first step, HF gas is supplied to the processing chamber 3 to adsorb HF molecules on the surface of the wafer 4. Subsequently, as a second step, the supply of HF gas is stopped, while the Ar gases 52 and 53 for diluting flow continuously, to exhaust (eliminate) the residual HF gas left in the gas phase. Subsequently, as a third step, $NH_3$ gas is supplied to the processing chamber 3 to adsorb $NH_3$ molecules on the surface of the wafer 4. At this time, HF molecules adsorbed in the first step and $NH_3$ molecules adsorbed in the third step react with the surface of the film to form the modified layer 2 of a compound containing nitrogen, hydrogen, silicon, and fluorine on the surface of the film.

The above-mentioned first to third steps are regarded as one step (also referred to as step set), and are repeated a plurality of times. As illustrated in FIG. 6, by repeating this step set, the film thickness of the modified layer 2 can be increased in a stepwise manner. Between the third step (supply of $NH_3$ gas) and the first step (supply of HF gas) of the next step set, the supply of $NH_3$ gas is stopped, while the Ar gases 52 and 53 for diluting flow continuously, and an exhausting step of exhausting the residual $NH_3$ gas left in the gas phase is executed. Preferably, herein, in the second step or the exhausting step, the pressure in the processing chamber 3 is made lower than the pressure in the processing chamber 3 in the first and third steps.

After increasing the film thickness of the modified layer 2 to a desired value, the supply of the wafer-cooling He gas is stopped. Next, the wafer 4 is heated by the IR lamp 60, the modified layer 2 formed on the film surface is thermally decomposed and desorbed, and the film is etched (the film is removed).

In the present embodiment, the IR lamp 60 is used for heating the wafer, but the heating method is not limited thereto. For example, the wafer stage may be heated or the wafer may be heated by separately conveying the wafer to a device that only performs heating. Further, in the present embodiment, the film of the object is etched by heating the wafer after repeating the first to third steps as one step set a plurality of times. Alternatively, it is also possible to achieve a desired etching amount by further repeating the combination of a plurality of times of gas irradiation and wafer heating.

In this case, after heating the wafer 4, He gas is supplied to the rear surface of the wafer to cool the wafer 4 to reach the temperature of the wafer stage 5 (refrigerant temperature), thus preparing for the next irradiation repetition step of HF gas and $NH_3$ gas. When the etching is completed, the electrostatic adsorption is interrupted to take out the wafer. The exhaust of He gas on the rear surface of the wafer is performed using the exhaust device 55 via the valve 54.

In the etching described in the present embodiment, $NH_3$ gas is applied after HF gas. Alternatively, the order of irradiation may be reversed, and $NH_3$ gas may be applied before HF gas.

In addition to the above-described technique using HF gas and $NH_3$ gas, the processing apparatus used in the present embodiment illustrated in FIG. 9 can generate $NH_3$ by plasma generation and use this in place of $NH_3$ gas. In the following modification, an alternative method of $NH_3$ gas by plasma generation is described with reference to FIG. 10.

Modification

First, the wafer 4 is transferred to the processing chamber 3 via the transfer port (not illustrated) provided in the processing chamber 3. After that, the wafer 4 is fixed on the wafer stage 5 by electrostatic adsorption by feeding power from the DC power source 31, while He gas is supplied to the rear surface of the wafer 4 for cooling the wafer.

Next, $N_2$ gas and $H_2$ gas are supplied into the quartz chamber 12 through the mass flow controller 50, the gas distributor 51, the gas dispersion plate 24, and the shower plate 23. $N_2$ gas and $H_2$ gas supplied to the quartz chamber 12 are further supplied to the processing chamber 3 via the flow path 27 and the slit plates 26. After that, $N_2$ gas and $H_2$ gas are made to flow continuously until the etching process is completed.

Thereafter, all the gases used for etching are supplied to the processing chamber 3 through the mass flow controller 50, the gas distributor 51, the gas dispersion plate 24, the shower plate 23, the flow path 27, and further through the slit plates 26.

As a first step, HF gas is supplied to the processing chamber 3 to adsorb HF molecules on the surface of the wafer 4. Subsequently, as a second step, the supply of HF gas is stopped while $N_2$ gas and $H_2$ gas flow continuously, and the residual HF gas left in the gas phase is exhausted. Subsequently, as a third step, the radio frequency power source 21 is turned on to generate plasma in the discharge region 13, and the plasma is applied to $N_2$ gas and $H_2$ gas in the quartz chamber 12. As a result, $N_2$ molecules react with $H_2$ molecules to generate $NH_3$ molecules.

$NH_3$ molecules generated in the plasma are supplied to the processing chamber 3 through the flow path 27 and the slit plates 26 and adsorbed on the surface of the wafer 4. At this time, HF molecules adsorbed in the first step and $NH_3$ molecules adsorbed in the third step react with the surface of the film to form the modified layer 2 of a compound containing nitrogen, hydrogen, silicon, and fluorine on the surface of the film.

Subsequently, the radio frequency power source 21 is turned off, while $N_2$ gas and $H_2$ gas flow continuously, to stop plasma generation. The above-mentioned first to third steps are regarded as one step (also referred to as step set), and are repeated a plurality of times. As illustrated in FIG. 6, by repeating this step set, the film thickness of the modified layer 2 is increased in a stepwise manner. Between the third step (adsorption of $NH_3$ molecules) and the first step (supply of HF gas) of the next step set, the supply of RF power is stopped, while $N_2$ gas and $H_2$ gas flow continuously, the step of exhausting the residual $NH_3$ gas left in the gas phase is exhausted.

After increasing the film thickness of the modified layer 2 to a desired value, the supply of the wafer-cooling He gas is stopped. Next, the wafer 4 is heated by the IR lamp 60, the modified layer 2 formed on the film surface is thermally decomposed and desorbed, and the film is etched (the film is removed). In the present embodiment, the IR lamp 60 is used for heating the wafer, but the heating method is not limited thereto. For example, the wafer stage may be heated or the wafer may be heated by separately conveying the wafer to a device that only performs heating.

Further, in the present embodiment, the film of the object is etched by heating the wafer after repeating the first to third steps a plurality of times as one step. Alternatively, it is also possible to achieve a desired etching amount by further repeating the combination of plural times of gas irradiation and wafer heating. In this case, after heating the wafer 4, He gas described above is supplied to the rear surface of the wafer to cool the wafer 4 to reach the temperature of the wafer stage 5 (refrigerant temperature), thus preparing for the next irradiation repetition step of HF gas and $NH_3$ gas. When etching is completed, electrostatic adsorption is turned off to take out the wafer. The exhaust of He gas on the rear surface of the wafer is performed using the exhaust device 55 via the valve 54.

In the etching described in the present embodiment, $N_2$ gas and $H_2$ gas are applied after HF gas. Alternatively, the order of irradiation may be reversed, and $N_2$ gas and $H_2$ gas may be applied before HF gas.

The present invention is not limited to the above-described embodiments, and may include various modifications. For example, the embodiments have been described in detail to facilitate the understanding of the present invention, and are not necessarily limited to the embodiments that include the entire structure described above. Further, the structure of a certain embodiment can be partially replaced by the structure of other embodiments, or the structure of other embodiments can be added to the structure of a certain embodiment. Further, some constituent components of the structures of the embodiments may be added, deleted, or substituted for by other constituent components.

What is claimed is:

1. An plasma etching method for etching a film layer of an object to be processed disposed in a processing chamber inside a vacuum container and is made of a member containing silicon, the plasma etching method comprising:

forming a film by repeating a set of steps a plurality of times, the set of steps including
a first step of introducing a gas containing at least hydrogen fluoride into the processing chamber and supplying hydrogen fluoride molecules to a surface of the film layer of the object to be processed,
after said first step, a second step of stopping the supply of the gas containing hydrogen fluoride into said processing chamber, and exhausting the interior of the processing chamber to reduce the gas containing hydrogen fluoride, and
after said second step, starting a third step of supplying hydrogen nitride molecules to the surface of the film layer of the object to be processed to form a compound layer containing nitrogen, hydrogen, and fluorine on the surface of the film layer; and
removing the compound layer formed on the surface of the film layer to be processed after the forming of the film.

2. The plasma etching method according to claim 1, wherein
the third step includes introducing a gas containing hydrogen nitride into the processing chamber.

3. The plasma etching method according to claim 2, wherein
the second step is executed after the introduction of the gas containing at least hydrogen fluoride into the processing chamber is stopped and before the introduction of the gas containing hydrogen nitride is started.

4. The plasma etching method according to claim 2, wherein
the set of steps includes exhausting the interior of the processing chamber before the start of the first step or after the end of the third step to remove a gas containing hydrogen nitride.

5. The plasma etching method according to claim 4, wherein
a pressure in the processing chamber in the second step or the exhausting step is made lower than a pressure in the processing chamber in the first step and the third step.

6. The plasma etching method according to claim 1, wherein
the third step includes introducing $N_2$ gas and $H_2$ gas into the processing chamber and generating plasma to generate $NH_3$ molecules.

7. The plasma etching method according to claim 6, wherein
the second step is executed after the introduction of the gas containing at least hydrogen fluoride into the processing chamber is stopped and before the plasma is generated.

8. The plasma etching method according to claim 6, wherein
the set of steps includes exhausting the interior of the processing chamber before the start of the first step or after the end of the third step to remove hydrogen nitride gas.

9. The plasma etching method according to claim 8, wherein
a pressure in the processing chamber in the second step or the exhausting is made lower than a pressure in the processing chamber in the first step and the third step.

10. The plasma etching method according to claim 1, wherein
the removal of the film includes heating the object to be processed to remove the compound layer.

11. The plasma etching method according to claim 10, further comprising:

cooling the object to be processed after the removal of the film.

12. An plasma etching apparatus comprising:

a vacuum container in which an object to be processed made of a member containing silicon is disposed;

a first gas source that supplies hydrogen fluoride gas into the vacuum container;

a second gas source that supplies hydrogen nitride gas into the vacuum container;

a heating device that heats the object to be processed; and a control unit, wherein the control unit repeats a set of steps a plurality of times, the set of steps including introducing hydrogen fluoride gas from the first gas source into the processing chamber and supplying hydrogen fluoride molecules to a surface of a film layer of the object to be processed, exhausting the interior of the processing chamber while stopping the supply of the hydrogen fluoride gas into the processing chamber to reduce the hydrogen fluoride molecules in said processing chamber, and introducing hydrogen nitride gas from the second gas source into the vacuum container to form a compound layer containing nitrogen, hydrogen, and fluorine on the surface of the film layer, and heating the object to be processed by the heating device to remove the compound layer formed on the surface of the film layer.

13. An plasma etching apparatus comprising:

a vacuum container in which an object to be processed made of a member containing silicon is disposed;

a first gas source that supplies hydrogen fluoride gas into the vacuum container;

a second gas source that supplies $N_2$ gas and $H_2$ gas into the vacuum container;

a plasma device that generates plasma in the vacuum container;

a heating device that heats the object to be processed; and a control unit, wherein the control unit repeats a set of steps a plurality of times, the set of steps including introducing hydrogen fluoride gas from the first gas source into the processing chamber and supplying hydrogen fluoride molecules to a surface of a film layer of the object to be processed, exhausting the interior of the processing chamber while stopping the supply of the hydrogen fluoride gas into the processing chamber to reduce the hydrogen fluoride molecules in said processing chamber, introducing $N_2$ gas and $H_2$ gas from the second gas source into the vacuum container and generating plasma in the vacuum container by the plasma device to generate $NH_3$ molecules, and forming a compound layer containing nitrogen, hydrogen, and fluorine on the surface of the film layer, and heating the object to be processed by the heating device to remove the compound layer formed on the surface of the film layer.

\* \* \* \* \*